United States Patent

Mostafazadeh et al.

[11] Patent Number: 6,034,423
[45] Date of Patent: Mar. 7, 2000

[54] LEAD FRAME DESIGN FOR INCREASED CHIP PINOUT

[75] Inventors: Shahram Mostafazadeh, San Jose; Joseph O. Smith, Morgan Hill, both of Calif.

[73] Assignee: National Semiconductor Corporation, Santa Clara, Calif.

[21] Appl. No.: 09/054,380

[22] Filed: Apr. 2, 1998

[51] Int. Cl.[7] .................................................. H01L 23/495
[52] U.S. Cl. ........................ 257/691; 257/676; 257/673; 257/666; 257/778
[58] Field of Search .................... 257/691, 676, 257/666, 778, 673

[56] References Cited

U.S. PATENT DOCUMENTS

| | | | |
|---|---|---|---|
| 5,389,817 | 2/1995 | Imamura et al. | 257/666 |
| 5,663,593 | 9/1997 | Mostafazadeh et al. | 257/666 |
| 5,796,589 | 8/1998 | Barrow | 257/778 |

FOREIGN PATENT DOCUMENTS

| | | | |
|---|---|---|---|
| 3166756A | 7/1991 | Japan | 257/676 |
| 4129250A | 4/1992 | Japan | 257/666 |
| 5121631A | 5/1993 | Japan | 257/666 |
| 6132419A | 5/1994 | Japan | 257/666 |

*Primary Examiner*—Wael Fahmy
*Assistant Examiner*—Hung Van Duong
*Attorney, Agent, or Firm*—Skjerven, Morrill, Macpherson, Franklin & Friel; Edward C. Kwok

[57] ABSTRACT

An integrated circuit (IC) module incorporates a modified lead frame having a die attach platform, a plurality of leads extending away from the die attach platform, and a plurality of bus bars surrounding the die attach platform. Multiple I/O pads on an IC chip mounted on the die attach platform requiring a common power supply voltage or communication signals are connected to a common bus bar, allowing a greater variety of signals to be provided from the fixed number of IC-PCB interconnections on the IC module. The bus bar design is readily incorporated into all IC module packaging techniques using conventional manufacturing processes. An embodiment of a lead frame for a lead frame BGA package also includes circular attachment pads at the ends of all leads in order to provide a circular area for mounting of solder balls to ensure consistent solder flow and uniform final solder ball profile without requiring circular vias.

10 Claims, 4 Drawing Sheets

LEAD FRAME DESIGN FOR INCREASED CHIP PINOUT

BACKGROUND OF THE INVENTION

1. Field of the Invention

The present invention relates to integrated circuit modules, and in particular, to modules using lead frames.

2. Description of the Related Art

An integrated circuit (IC) module supports and protects an IC chip, or die, while also providing electrical paths between the IC chip and a host printed circuit board (PCB). As shown in FIG. 1b, an embodiment of a common IC module 100 includes an IC chip 110 mounted on a metal lead frame 120, and encapsulated by a ceramic or plastic preformed casing 130. An electrical interface between IC module 100 and a host PCB is provided by multiple IC-PCB interconnections available at the exterior surface of casing 130. Lead frame 120 provides power and signal distribution for IC chip 110, while casing 130 protects IC chip 110 from hostile environments. IC-PCB interconnections can be provided in various ways. For surface mount packages, pins 140 formed directly from lead frame 120 are commonly used. Alternatively, as described in U.S. Pat. No. 5,663,593, issued Sep. 2, 1997 to Mostafazadeh et al., a lead frame ball grid array (BGA) package includes solder balls 150 that provide the IC-PCB interconnections, as shown in FIG. 1c. Other conventional techniques include pin-through-hole technology and leadless chip carriers.

Lead frame 120, etched or stamped as a single unit from a thin metal sheet or strip, includes a central die attach platform 121 surrounded by narrow leads 122, rigidly maintained by a skirt 123, as shown in FIG. 1a. IC chip 110 mounted on the top surface of platform 121 includes a plurality of input/output (I/O) pads which must be electrically connected to the PCB in order for IC chip 110 to function properly. The I/O pads include power and ground I/O pads to provide power to IC chip 110, and signal I/O pads for data and control signal communications. The I/O pads are wire bonded to leads 122, typically with fine-diameter gold wires 114. After the assembly formed by lead frame 120, IC chip 110, and wires 114 is encapsulated by casing 130, skirt 123 is removed by trimming, and the desired number of pins 140 are created, as shown in FIG. 1b. FIG. 1c depicts an embodiment of a conventional lead frame BGA package. Rather than multiple pins 140, at each interconnection location, a solder ball 150 is installed. In a lead frame BGA package, encapsulant material is typically dispensed over the top surface of the assembly formed by lead frame 120, IC chip 110, and wires 114 and then molded into a casing 160, although a preformed cap is sometimes used. A mask 170 on the bottom surface of lead frame 120 includes openings, or vias, through which solder balls 150 are attached to lead frame 120. Optional solder balls 150 on the bottom surface of platform 121 can be used to provide supplemental heat dissipation for IC chip 110. Mask 170 can be formed using a solder mask, selective plating, or even patterned polyamide tape. Ideally, mask 170 would provide circular vias in order to ensure a uniform height and profile for all solder balls 150 applied to lead frame 120. However, because of the difficulties associated with defining a circular area in a narrow region, rectangular vias are typically provided for leads 122. As a result, height variations can occur among the installed solder balls 150 on leads 120, as the extent to which solder flow will occur into the corners of the rectangular vias is inconsistent and unpredictable. The height variations can ultimately lead to poor electrical contact with the host PCB. It is therefore desirable to provide a method for producing circular vias for the leads of a lead frame BGA package.

The allowable number of IC-PCB interconnections, or module pinout, is defined by standard module interface requirements, either through explicit module pinout specification or restrictions on interface area. Therefore, in a conventional IC module where each I/O pad of the IC chip is coupled to a unique one of the IC-PCB interconnections, the allowable number of I/O pads, or chip pinout, is restricted by the module pinout. This is the case even when multiple I/O pads require the same interface signal. For example, if IC chip 110 shown in FIG. 1b includes two power I/O pads, each would require a separate IC-PCB interconnection, depleting the number of interconnections available for signal I/O pads. Similarly, redundant ground I/O pads would occupy additional IC-PCB interconnections, despite being coupled to the same electrical potential. Although some IC module designs connect multiple pads to a single IC-PCB interconnection, this is typically not done because I/O pads requiring a common signal are generally not located in close proximity, making wire bonding to a common interconnection difficult.

Accordingly, it is desirable to provide a module design that maximizes chip pinout without increasing module pinout.

SUMMARY OF THE INVENTION

The present invention provides a lead frame design for taking advantage of redundant signal requirements, including redundant power supply voltage or ground potential requirements, to increase the allowable chip pinout for a given module pinout.

An embodiment of the present invention includes bus bars that provide a common connection area for shared power, ground, or communications signals. By connecting all I/O pads on an IC chip requiring a common input to a single bus bar, multiple I/O pads can be serviced by a single IC-PCB interconnection. The present invention can be used in any IC module type using a lead frame, including dual in-line packages (DIP), quad flat pacs, plastic leaded chip carriers (PLCC), and lead frame BGA packages. The bus bars are incorporated into the lead frame using conventional lead frame manufacturing processes without substantial increase in lead frame complexity or cost.

Additionally, an embodiment of the present invention provides a lead frame having circular attachment pads for solder balls at the end of all leads. The attachment pads eliminate the need for circular vias while ensuring consistent solder profile creation during solder ball installation.

The present invention will be better understood upon consideration of the accompanying drawings and the detailed description below.

BRIEF DESCRIPTION OF THE DRAWINGS

Use of the same reference number in different figures indicates similar or like elements.

DETAILED DESCRIPTION

Figures 1, 1A:
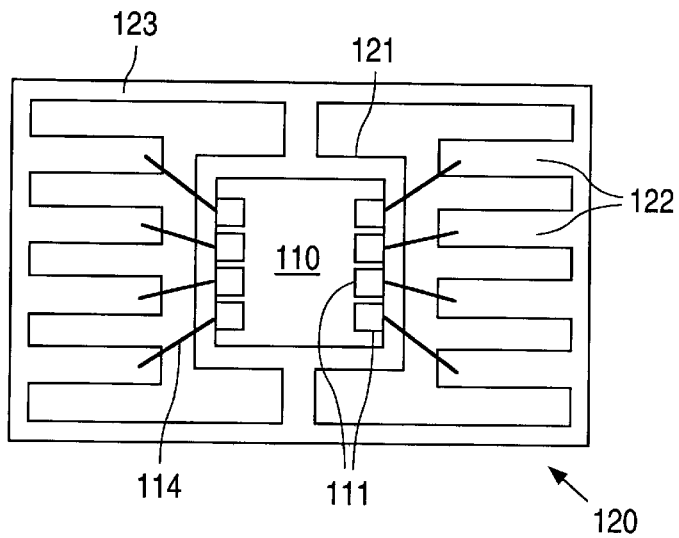
FIGS. 1a–1c show a conventional lead frame design incorporated into an IC module.
Figures 1, 1A, 2:
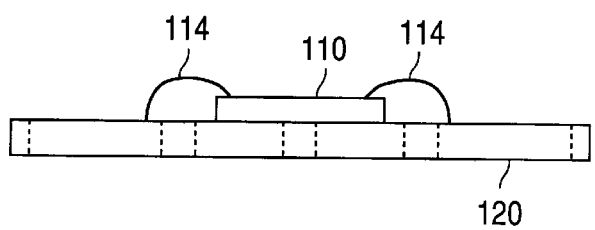
Figures 1, 1B:
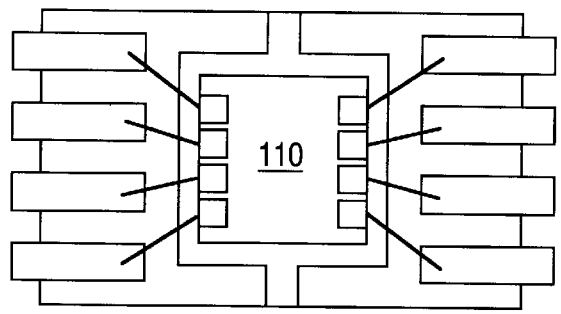
Figures 1, 1B, 2:
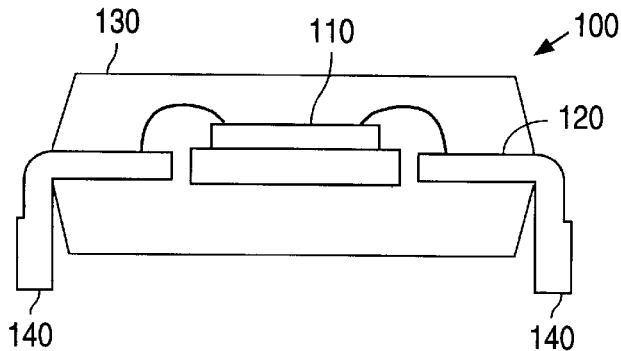
Figures 1, 2A:
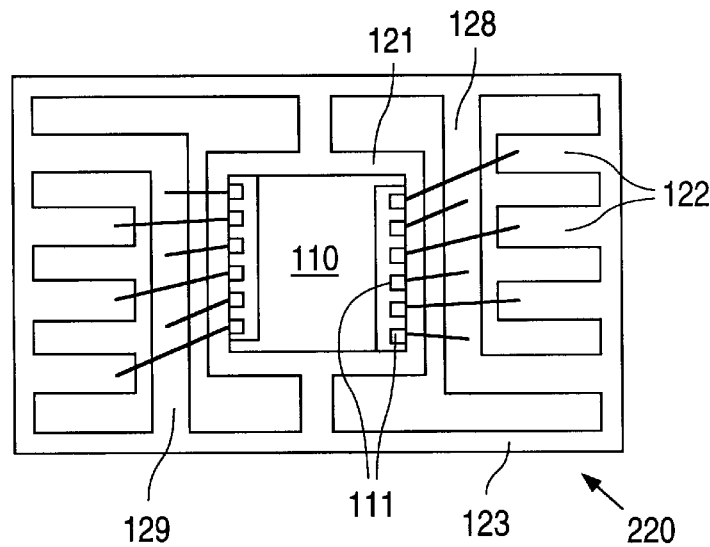
FIGS. 2a–2b show an embodiment of the present invention incorporated into a pin-type IC module.
Figures 2, 2A:
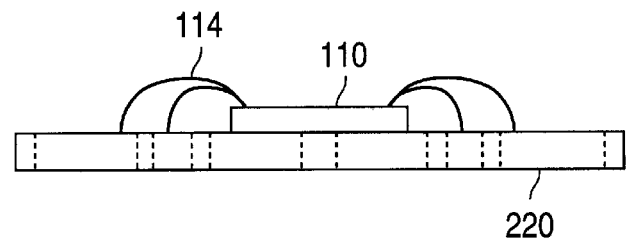
Figures 1, 2B:
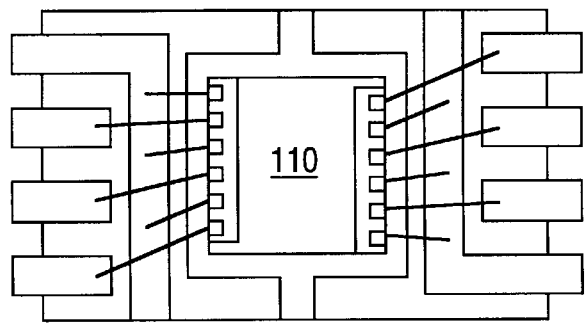
Figures 2, 2B:
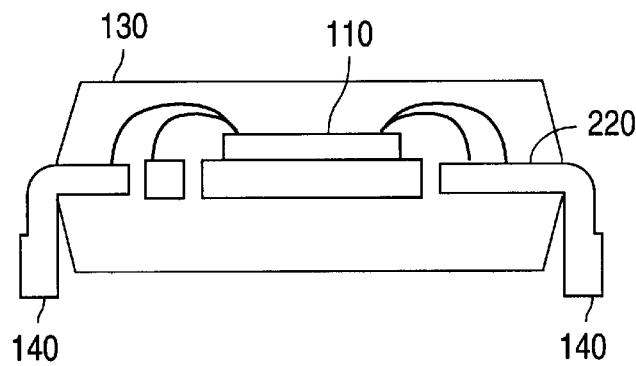

The present invention increases the allowable chip pinout of an IC chip for a given IC module that uses a lead frame packaging element. By providing bus bars for power and ground voltages or shared signals, the lead frame design of the present invention increases the effective number of available electrical signal paths between the internal IC chip and a host PCB into which the IC module is installed. FIG. 2a shows an embodiment of the present invention to be used in a pin-type chip package. A metal lead frame 220 is stamped or etched from a thin metal sheet or strip. A central die attach platform 121 is surrounded by narrow leads 122 and bus bars 128 and 129, all of which are rigidly maintained by a skirt 123. An IC chip 110 mounted on platform 121 includes multiple I/O pads 111 for power and signal connections to IC chip 110. Signal I/O pads are wire bonded to leads 122 by wires 114. All power I/O pads are wire bonded to bus bar 128, and all ground I/O pads are connected to bus bar 129. Subsequent encapsulation by a casing 130 and formation of pin-type IC-PCB interconnections 140 as shown in FIG. 2b is performed as in a conventional IC module. Because bus bars 128 and 129 provide a common attachment area for multiple power and ground I/O pads, the total number of signal I/O pads on IC chip 110, and therefore chip pinout, is increased over the conventional design shown in FIG. 1a.

Figures 1, 1C:
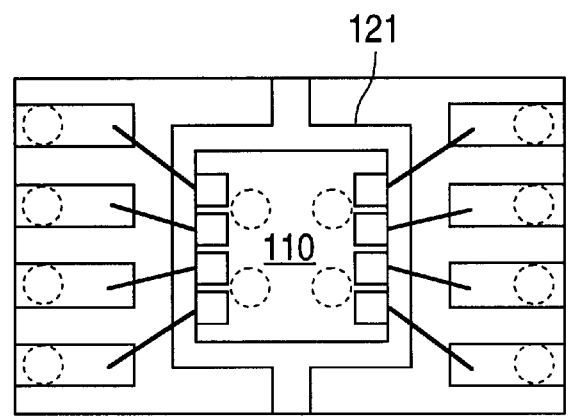
Figures 1, 1C, 2:
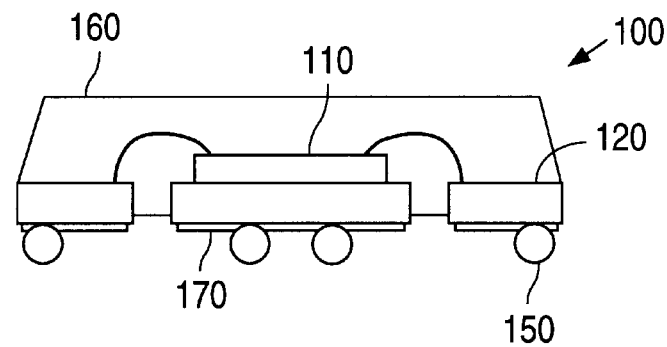
Figures 1, 2C:
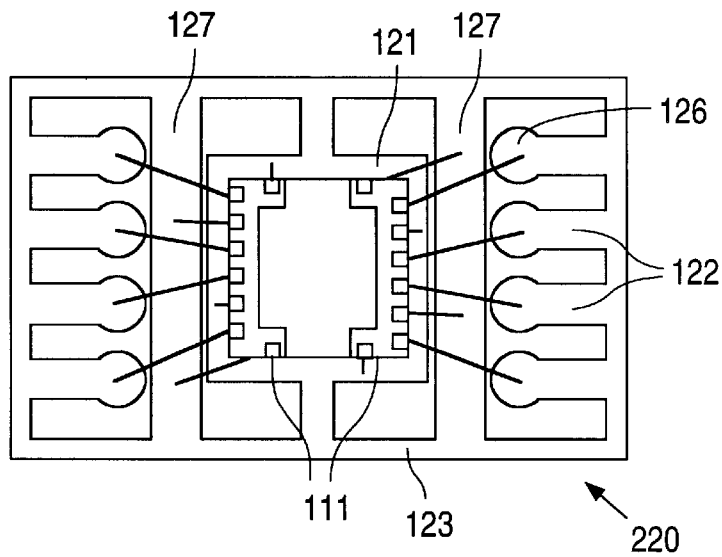
FIGS. 2c–2d show an embodiment of the present invention incorporated into a lead frame BGA IC module.
Figures 2, 2C:
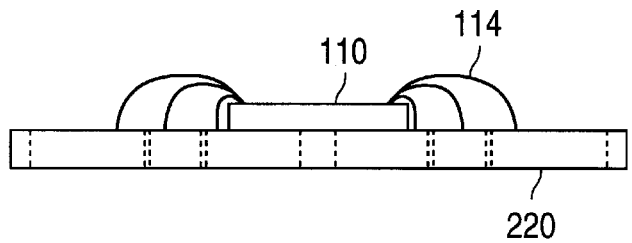
Figures 1, 2D:
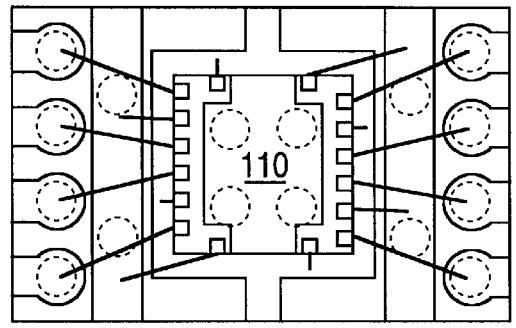
Figures 2, 2D:
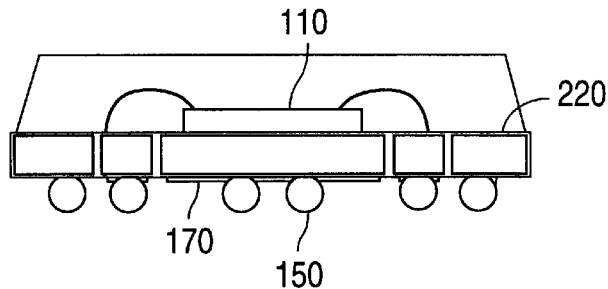

FIG. 2c depicts an embodiment of the present invention incorporated into a lead frame ball grid array (BGA) package. Metal lead frame 220 is stamped or etched from a thin metal sheet or strip. Central die attach platform 121 is surrounded by narrow leads 122 and bus bars 127, all of which are rigidly maintained by skirt 123. A circular attachment pad 126 is located at the end of each lead 122. IC chip 110 includes multiple I/O pads 111 and is mounted on the top surface of platform 121. Signal I/O pads are wire bonded to circular attachment pads 126 by wires 114. All power I/O pads are wire bonded to bus bars 127, while all ground I/O pads are connected to platform 121. Installation of protective casing 160 and removal of skirt 123 is performed in the same manner as in conventional lead frame BGA packages, as indicated in FIG. 2d. Mask 170 provides vias through which solder balls 150 are mounted on the bottom surface of lead frame 220. However, because attachment pads 126 define circular areas for the application of solder balls 150, mask 170 can simply mask each lead up to the edge of the attach pad 126, and is not required to provide difficult-to-produce circular vias. Proper location of attachment pads 126 can even completely eliminate the need for masking leads 122. Circular attachment pads 126 provide an inherent solder flow boundary, ensuring consistent post-installation solder ball profiles. In addition, by connecting the solder balls 150 mounted on the bottom surface of platform 121 to the ground potential of the host PCB, platform 121 can be used as a ground bus bar for IC chip 110. Therefore, because bus bars 127 and platform 121 provide a common attachment area for multiple power and ground I/O pads, respectively, the total number of signal I/O pads on IC chip 110, and therefore chip pinout, is once again increased over the conventional design shown in FIG. 1c.

In this manner, the present invention allows greater flexibility in IC chip design by enabling the use of larger numbers of bonding pads for signal communications. The lead frame design of the present invention is compatible with conventional manufacturing procedures and processes. It should be noted that while particular embodiments of the present invention have been shown and described, it will be apparent to those skilled in the art that many modifications and variations thereto are possible, all of which fall within the true spirit and scope of the invention. For example, the bus bar design can be incorporated into any IC packaging module using a lead frame component, including dual in-line packages (DIP), quad flat pacs, plastic leaded chip carriers (PLCC), and lead frame ball grid array packages (BGA). In addition, the lead frame configuration is not intended to be limited to construction of lead frame 220 shown in FIGS. 2a–2d. The size, orientation, and location of bus bars can be varied to provide optimum performance and convenience for a specific situation. Also, while the described embodiments include two bus bars, there is no restriction on the number of bus bars that can be incorporated into a particular implementation, and bus bars can be used to distribute data as well as power signals. Finally, a bus bar can even be used as a PCB interconnect to assist in signal distribution on the host PCB.

We claim:

1. An integrated circuit package comprising,
    (a) a lead frame comprising:
        a die attach platform; and
        a plurality of elongated leads which are electrically isolated from said die attach platform, each of said elongated leads including a circular portion formed as an attachment pad; and
    (b) a substrate, having first and second surfaces on opposite sides of said substrate, for providing rigid support to said lead frame, said substrate contacting said lead frame on said first surface and having vias of non-circular cross sections to allow electrical connections between said first and second surfaces.

2. The package of claim 1, further comprising a first bus bar which is electrically isolated from said die attach platform and said plurality of elongated leads.

3. The package of claim 2 wherein:
    said lead frame further comprises a second bus bar which is electrically isolated from said die attach platform, said plurality of elongated leads, and said first bus bar;
    said die attach pad is positioned between said first and second bus bars; and
    said plurality of elongated leads extend radially away from said first and second bus bars and said die attach platform.

4. The package of claim 3 further comprising an integrated circuit chip mounted on said die attach platform, said integrated circuit chip having a plurality of power I/O pads, a plurality of ground I/O pads, and a plurality of signal I/O pads, wherein:
    each of said plurality of signal I/O pads is electrically connected with a selected one of said plurality of leads;
    said plurality of power I/O pads are electrically connected to said first bus bar; and
    said plurality of ground I/O pads are electrically connected to said second bus bar.

5. The package of claim 3 further comprising an integrated circuit chip mounted on said die attach platform, said integrated circuit chip having a plurality of power I/O pads, a plurality of ground I/O pads, and a plurality of signal I/O pads, wherein:
    each of said plurality of signal I/O pads is electrically connected with a selected one of said plurality of leads;
    said plurality of power I/O pads are electrically connected to said first bus bar or said second bus bar; and
    said plurality of ground I/O pads are electrically connected to said die attach platform.

6. The package of claim 1, wherein an integrated circuit chip is attached on said die attach platform, said package further comprising:

a mask layer formed on said second surface, said mask layer defining a plurality of openings exposing said vias; and a plurality of solder balls, each of said plurality of solder balls being electrically connected to one of said attachment pads by solder through one of said openings and one of said vias.

7. The package of claim 6 wherein said mask layer comprises a solder mask.

8. The package of claim 7 wherein said mask layer comprises a plated layer, the material of said plating layer being resistant to solder flow.

9. The package of claim 4 wherein:

said first bus bar is electrically connected to one of said plurality of leads that is designated to be electrically connected to the external power supply of said integrated circuit chip;

said second bus bar is electrically connected to the one of said plurality of leads that is designated to be electrically connected to ground potential; and said lead frame and said integrated circuit chip are encapsulated in a protective casing.

10. In an integrated circuit (IC) package for accommodating an IC chip, wherein said IC chip includes a plurality of I/O pads for signal communications and a portion of said plurality of said I/O pads require a common signal, a method comprising the steps of:

providing a lead frame having (a) a die attach platform; and (b) a plurality of leads, each lead having a circular portion formed as an attachment pad;

providing a substrate having first and second surfaces on opposite sides of said substrate to provide rigid support to said lead frame, said substrate having vias of non-circular cross sections to allow electrical connections between said first and second surfaces;

attaching said lead frame to said first surface of said substrate;

attaching said IC chip to said die attach platform;

electrically connecting said said I/O pads to said bus bar and said attachment pads;

providing a solder mask on said second surface of said substrate, said solder masks having openings corresponding to said vias; and attaching solder balls to said solder mask and providing a flow of solder into said opening and said vias, said solder reaching said attachment pads so that an electrical connection is made between each solder ball and an I/O pad of said I/C chip.

* * * * *